(12) United States Patent
Lin

(10) Patent No.: US 9,905,683 B2
(45) Date of Patent: Feb. 27, 2018

(54) SEMICONDUCTOR POWER DEVICE

(71) Applicant: EPISTAR CORPORATION, Hsinchu (TW)

(72) Inventor: Yi-Chih Lin, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/337,670

(22) Filed: Oct. 28, 2016

(65) Prior Publication Data
US 2017/0125573 A1 May 4, 2017

(30) Foreign Application Priority Data

Oct. 28, 2015 (TW) .............................. 104135349 A

(51) Int. Cl.
*H01L 31/0256* (2006.01)
*H01L 29/778* (2006.01)
*H01L 29/66* (2006.01)
*H01L 29/08* (2006.01)

(52) U.S. Cl.
CPC ...... *H01L 29/7787* (2013.01); *H01L 29/0847* (2013.01); *H01L 29/66462* (2013.01)

(58) Field of Classification Search
CPC ........... H01L 29/7787; H01L 29/66462; H01L 29/0847

USPC ......................................................... 257/76
See application file for complete search history.

(56) References Cited

U.S. PATENT DOCUMENTS

| | | | |
|---|---|---|---|
| 7,816,707 B2 | 10/2010 | Hikira et al. | |
| 7,915,643 B2* | 3/2011 | Suh | H01L 29/1066 257/192 |
| 8,168,486 B2 | 5/2012 | Hebert | |
| 8,569,769 B2 | 10/2013 | Hwang et al. | |
| 8,716,141 B2 | 5/2014 | Dora et al. | |
| 2009/0065810 A1* | 3/2009 | Honea | H01L 27/0605 257/192 |
| 2012/0068227 A1 | 3/2012 | Hikita et al. | |
| 2012/0267687 A1 | 10/2012 | Jeon et al. | |
| 2014/0197421 A1 | 7/2014 | Dora et al. | |

* cited by examiner

*Primary Examiner* — Theresa T Doan
(74) *Attorney, Agent, or Firm* — Ditthavong & Steiner, P.C.

(57) ABSTRACT

A semiconductor power device includes a substrate, an active region having a recess and disposed on the substrate, a first conductivity type semiconductor layer disposed on the recess and devoid of overlapping with the recess, a gate electrode disposed on the active region wherein a portion of the gate electrode is disposed in the recess, a dielectric layer between the active region and the gate electrode, and a two dimension electron gas formed in the active region.

19 Claims, 9 Drawing Sheets

SEMICONDUCTOR POWER DEVICE

REFERENCE TO RELATED APPLICATION

The present application claims the right of priority based on TW application Serial No. 104135349, filed on Oct. 28, 2015, and the content of which is hereby incorporated by reference in its entirety.

FIELD OF THE INVENTION

The present application is related to a semiconductor device, and more particularly, to a semiconductor power device.

DESCRIPTION OF THE PRIOR ART

In recent years, with the growing demand for high frequency or high power products, a semiconductor device made of gallium nitride (GaN) materials and having a stack of AlGaN/GaN is widely used in power supplies, DC/DC converters, DC/AC inverters, uninterruptible power supplies, vehicles, motors, and wind powers due to its characteristics of high electron mobility and being able to operate at high frequency, high power, and high temperature.

SUMMARY OF DISCLOSURE

A semiconductor power device includes a substrate, an active region having a recess and disposed on the substrate, a first conductivity type semiconductor layer disposed on the active region and devoid of overlapping with the recess, a gate electrode disposed on the active region wherein a portion of the gate electrode is disposed in the recess, a dielectric layer between the active region and the gate electrode, and a two dimension electron gas formed in the active region.

BRIEF DESCRIPTION OF THE DRAWINGS

The present application is illustrated by way of example and not limited by the figures of the accompanying drawings in which same references indicate similar elements. Many aspects of the disclosure can be better understood with reference to the following drawings.

DETAILED DESCRIPTION OF THE PREFERRED EMBODIMENTS

Figure 1:
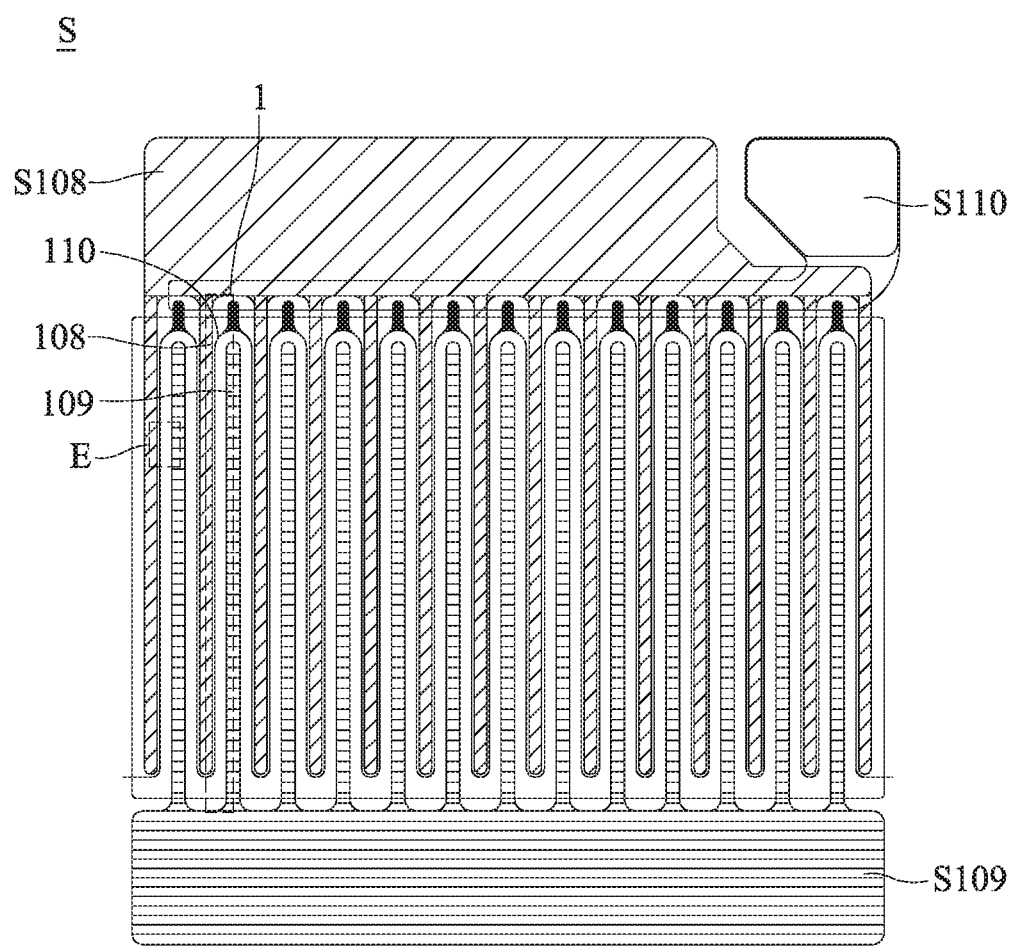
FIG. 1 shows a top view of a semiconductor power device disclosed in a first embodiment of the present application.

In order to make the aforementioned features and advantages of the present application more comprehensible, embodiments accompanying figures are described in details below.

A description accompanied with drawings is provided in the following to explain embodiments of the present application. However, the invention may still be implemented in many other different forms and should not be construed as limited to the embodiments described herein. In the drawings, for the purpose of clarity, the sizes and relative sizes of each layer and region in the drawings may be illustrated in exaggerated proportions.

FIG. 1 shows a top view of a semiconductor power device S in accordance with a first embodiment of the present application. The semiconductor power device S, for example, is a device including three terminals. In the embodiment, the semiconductor power device S includes a source electrode pad S108, a drain electrode pad S109, a gate electrode pad S110, and at least one semiconductor cell 1. The semiconductor cell 1 can be a field effect transistor like a high electron mobility transistor (HEMT). In the first embodiment, the semiconductor cell 1 includes a source electrode 108 electrically connecting to the source electrode pad S108, a drain electrode 109 electrically connecting to the drain electrode pad S109, a gate electrode 110 electrically connecting to the gate electrode pad S110, and a semiconductor stack (not shown in figures). A material, a position, a layout of the semiconductor stack can be adjusted based on actual needs. Additionally, the semiconductor cell 1 of the semiconductor power device S can be replaced by the other semiconductor cell in other embodiments. Moreover, details of a region E of the semiconductor cell 1 are recited as follows.

Figure 2A:
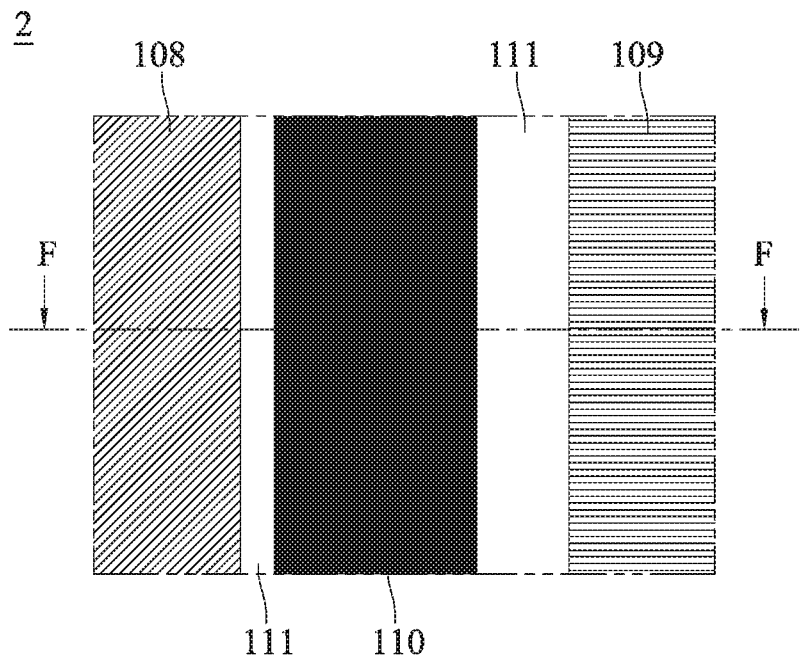
FIG. 2A shows a detailed view of a semiconductor cell disclosed in a second embodiment of the present application.
Figure 2B:
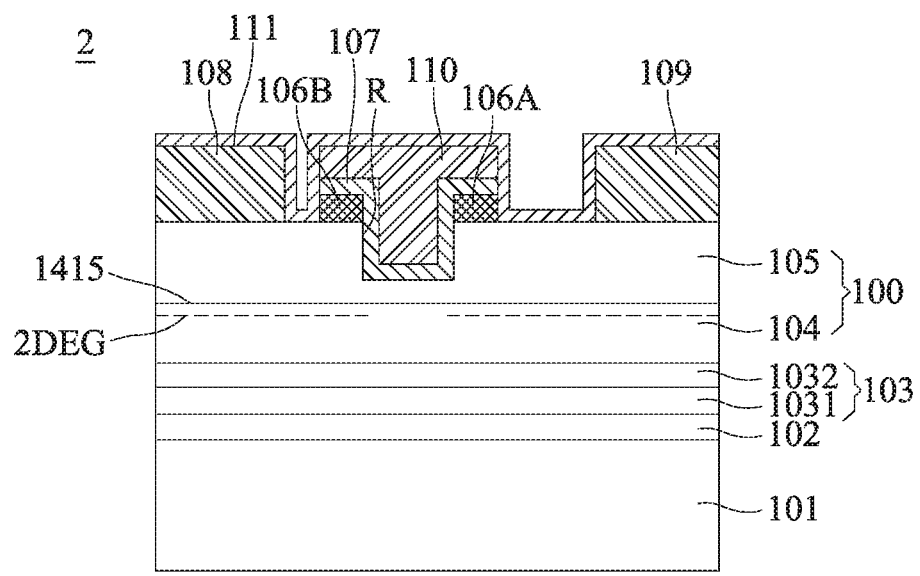
FIG. 2B shows a cross-sectional view taken along a sectional line FF of the semiconductor cell as shown in FIG. 2A.
Figure 2C:
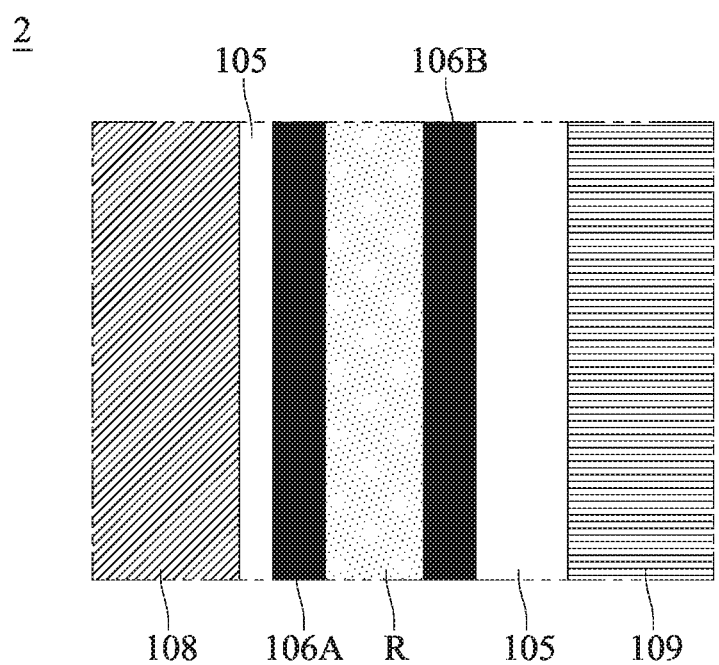
FIG. 2C shows a perspective view of a passivation layer and a gate electrode as shown in FIG. 2A.

FIG. 2A, FIG. 2B and FIG. 2C show a semiconductor cell 2 in accordance with a second embodiment of the present application. In the embodiment, the semiconductor cell 2 can replace the semiconductor cell 1 in FIG. 1 for forming the semiconductor power device S. For clearly reciting details of the semiconductor cell 2, FIG. 2A shows a detailed view of the semiconductor cell 2 and herein the region E of FIG. 1 is enlarged. Further, FIG. 2B shows a cross-sectional view taken along a sectional line FF of the semiconductor cell 2 as shown in FIG. 2A. The semiconductor cell 2, for example an enhancement mode transistor, includes a substrate 101, a nucleation layer 102, a buffer structure 103, an active region 100, first conductivity type semiconductor layers 106A and 106B, a recess R, a dielectric layer 107, a source electrode 108, a drain electrode 109, a gate electrode 110, and a passivation layer 111 covering the source electrode 108, the drain electrode 109, the gate electrode 110, and a portion of the active region 100. In the embodiment, the buffer structure 103 includes a first semiconductor stack 1031 and a second semiconductor stack 1032, and the active region 100 includes a channel 104 and a barrier layer 105 wherein a two dimensional electron gas is formed near an interface 1415 between the channel layer 104 and the barrier layer 105. FIG. 2C shows a perspective view of the passivation layer 111 and the gate electrode 110 as shown in FIG. 2A from a top view, and herein the first conductivity type semiconductor layers 106A and 106B are disposed at two sides of the recess R respectively and do not overlap with the recess R.

Figure 3A:
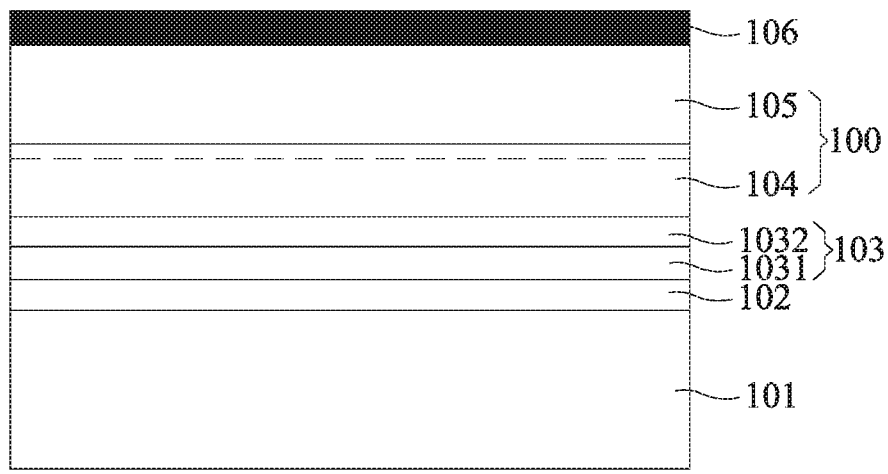
FIG. 3A to FIG. 3F show manufacturing processes of the semiconductor cell disclosed in the second embodiment of the present application.
Figure 3B:
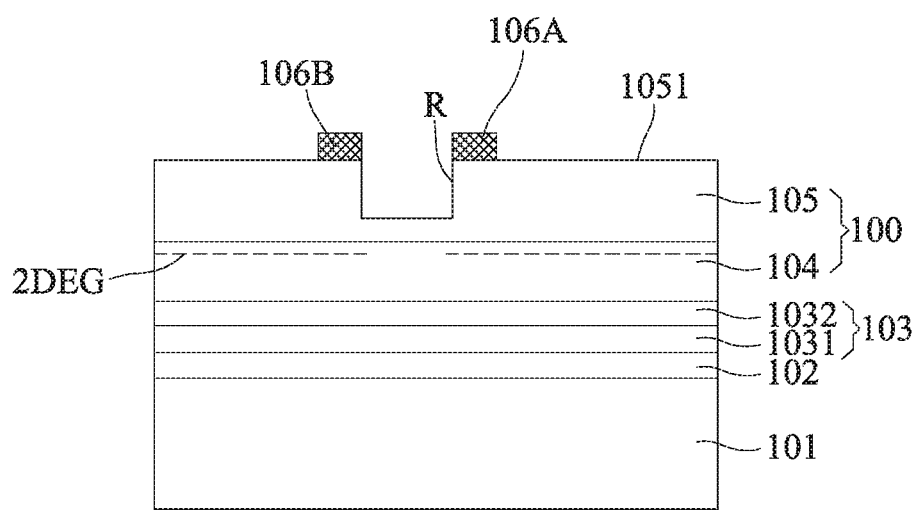
Figure 3C:
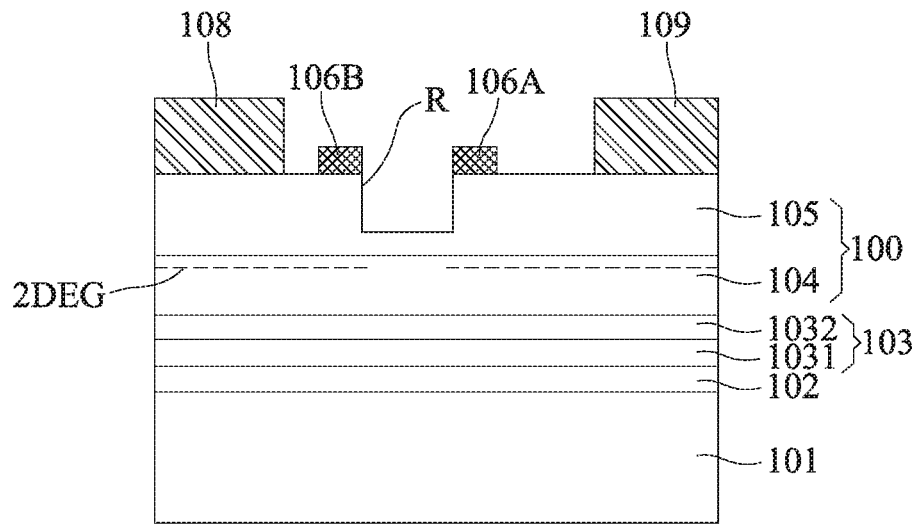
Figure 3D:
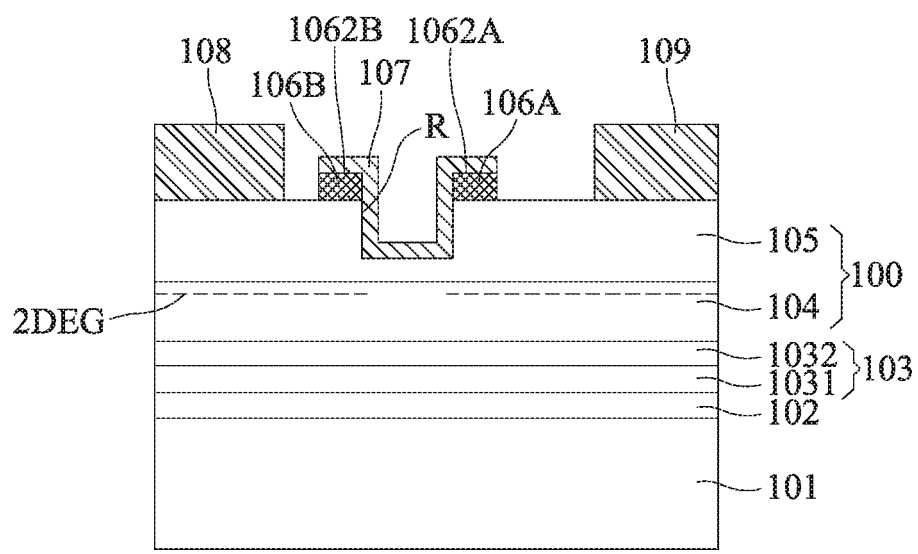
Figure 3E:
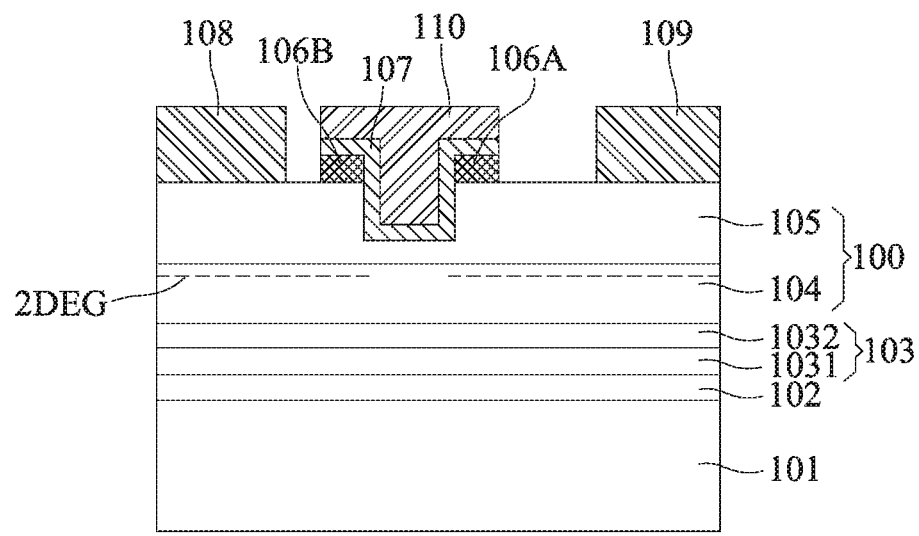
Figure 3F:
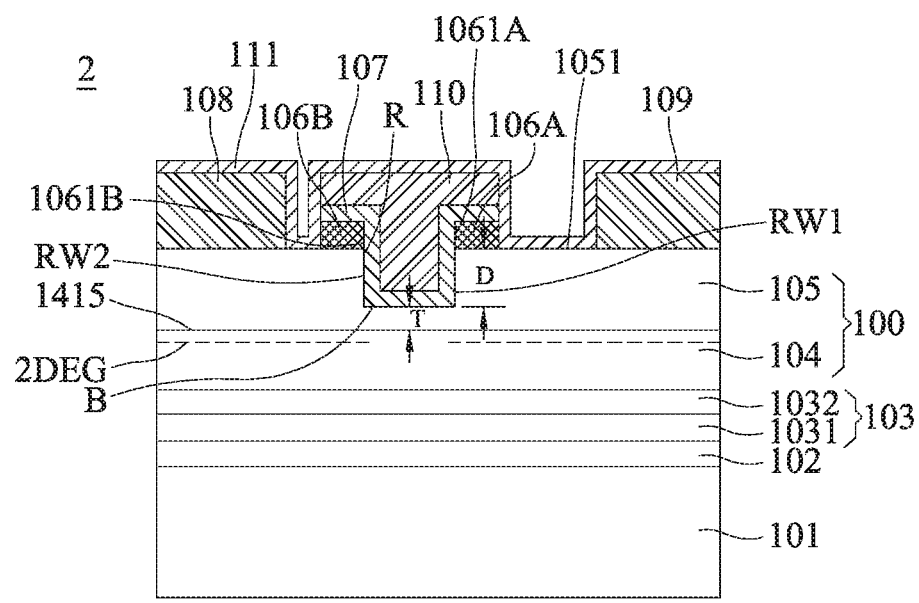

FIG. 3A to FIG. 3F show manufacturing processes of the semiconductor cell 2 in accordance with the second embodiment of the present application. Referring to FIG. 3A, the nucleation layer 102, the buffer structure 103 including the first semiconductor stack 1031 and the second semiconductor stack 1032, the active region 100 including the channel layer 104 and the barrier layer 105, and a first conductivity type semiconductor layer 106 are epitaxially grown on the substrate 101 sequentially. Referring to FIG. 3B, the recess R is formed by etching a portion of the first conductivity type semiconductor layer 106 and the active region 100. In details, the recess R is formed by etching the barrier layer 105 from a first top surface 1051 of the barrier layer 105, and then portions of the first conductivity type semiconductor layers (labelled in 106A and 106B) are remained at two sides of the recess R. Referring to FIG. 3C and FIG. 3D, the source electrode 108 and the drain electrode 109 are formed on the barrier layer 105 by an approach like physical vapor deposition. Then the dielectric layer 107 is formed on the recess R and the first conductivity type semiconductor layers 106A and 106B by an approach like chemical vapor deposition. Referring to FIG. 3E and FIG. 3F, the gate electrode 110 is formed on the dielectric layer 107 by an approach like physical vapor deposition, and the passivation layer 111 is formed to cover the source electrode 108, the drain electrode 109, the gate electrode 110, and the first top surface 1051 of the barrier layer 105 by an approach like chemical vapor deposition.

In the embodiment, the substrate 101 can include a conductive substrate or an insulative substrate. Herein, the conductive substrate can include a semiconductor material such as silicon, silicon carbide, gallium nitride. When the substrate 101 is an insulative substrate, a material of the substrate 101 can include an oxide material like sapphire. In the embodiment, the substrate 101 can be a silicon substrate with a thickness of 600 μm to 1200 μm. When manufacturing the semiconductor power device S, the substrate 101 is polished to a thickness of 300 μm to 10 μm by an approach like chemical mechanical polishing/planarization (CMP), so as to be suitable for package and heat dissipation, or the substrate 101 can be entirely or partially removed for eliminating leakage paths to reduce the impact of leakage.

The nucleation layer 102 is epitaxially grown on the substrate 101 by a growth method, such as metal-organic chemical vapor deposition (MOCVD), molecular-beam epitaxy (MBE) or hydride vapor phase epitaxy (HVPE). Herein, a thickness of the nucleation layer 102 is in a range between 20 nm and 200 nm. The nucleation layer 20 can include an IIIA-VA semiconductor material such as aluminum nitride (AlN), gallium nitride (GaN), or aluminum gallium nitride (AlGaN). In the embodiment, the nucleation layer 20 can be a polycrystalline structure.

The buffer structure 103 with a thickness of 1 μm to 10 μm is epitaxially grown on the nucleation layer 102. The buffer structure 103 can include a single layer, two layers or multiple layers. The buffer structure 103 can also be a monocrystalline structure. The multiple layers can include grading layers or a superlattice stack having two or more than two layers made of different materials. The buffer structure 103 with a single layer, two layers or multiple layers can include a group IIIA-VA material such as aluminum nitride (AlN), gallium nitride (GaN), aluminum gallium nitride (AlGaN), aluminum indium nitride (AlInN), or aluminum indium gallium nitride (AlInGaN), and other elements like carbon can be doped in the buffer structure 103 with a fixed concentration or grading concentration varying along a growth direction. In the embodiment, the buffer structure 103 includes the first semiconductor stack 1031 and the second semiconductor stack 1032. Herein, the first semiconductor stack 1031 can include an aluminum gallium nitride (AlGaN) grading layer or a carbon-doped aluminum gallium nitride (AlGaN) grading layer with a thickness of 0.1 μm to 5 μm. The first semiconductor stack 1031 can be an aluminum nitride (AlN) layer with a thickness of 5 nm to 50 nm together with an aluminum gallium nitride (AlGaN) layer with a thickness of 5 nm to 50 nm, or a carbon-doped aluminum nitride (AlN) layer with a thickness of 5 nm to 50 nm together with a carbon-doped aluminum gallium nitride (AlGaN) layer with a thickness of 5 nm to 50 nm. A thickness of the second semiconductor stack 1032 is in a range between 1.5 μm to 3 μm, and a material of the second semiconductor stack 1032 can include gallium nitride (GaN) or grading carbon-doped gallium nitride (GaN). Additionally, the substrate 101 of the embodiment can be a silicon substrate, and the nucleation layer 102 and the buffer structure 103 are formed on the plane (111) of the substrate 101 along a direction [0001] for releasing a lattice strain between the substrate 101 and the channel layer 104 so as to improve the epitaxial quality.

The active region 100 is epitaxially grown on the buffer structure 103 and can include two layers or multiple layers, and the active region 100 can include a group IIIA-VA material such as aluminum nitride (AlN), gallium nitride (GaN), aluminum gallium nitride (AlGaN), aluminum indium nitride (AlInN), or aluminum indium gallium nitride (AlInGaN). In the embodiment, the active region 100 include the channel layer 104 and the barrier layer 105 wherein the channel layer 104 has a first energy gap, and the barrier layer 105 has a second energy gap greater than the first energy gap of the channel layer 104. In other words, a lattice constant of the barrier layer 105 is smaller than a lattice constant of the channel layer 104. A thickness of the channel layer 104 is about 0.15 μm to 1 μm, and the channel layer 104 can include $In_xGa_{(1-x)}N$ (wherein 0≤x<1) such as gallium nitride (GaN) or indium gallium nitride (InGaN). A thickness of the barrier layer 105 can be in a range between 10 nm and 30 nm, a material of the barrier layer 105 can be $Al_yIn_zGa_{(1-y-z)}N$ (wherein 0<y<1, and 0≤z<1) such as aluminum indium nitride (AlInN), aluminum gallium nitride (AlGaN) or aluminum indium gallium nitride (AlInGaN). Since each of the channel layer 104 and the barrier layer 105 tends to have spontaneous polarization due to a displacement between the centroid of the charge and the centroid of an atom and a piezoelectric polarization is formed between the channel layer 104 and the barrier layer 105 due to a lattice constant mismatch therebetween, a two-dimensional electron gas is formed near the interface 1415 between the channel layer 104 and the barrier layer 105. Although the channel layer 104 and the barrier layer 105 in the embodiment are undoped, in practical application the channel layer 104 and/or the barrier layer 105 can be doped with dopants like silicon from silane precursor for enhancing the piezoelectric polarization and the spontaneous polarization so that a concentration of the two-dimensional electron gas formed near the interface 1415 can be increased.

Referring to FIG. 3B, the recess R is formed by etching the barrier layer 105 downwards from the first top surface 1051 thereof by a method such as dry etching or wet etching. Herein the recess R has a depth D about 5 nm to 25 nm from the first top surface 1051 of the barrier layer 105 to a bottom B of the recess R. A material of the barrier layer 105, for example, an aluminum gallium nitride ($Al_xGa_{1-x}N$, wherein x is about 0.2), has a thickness of 26 nm, and a depth of 21 nm. In other words, a remained thickness of the barrier layer 105 below the recess R is smaller than 5 nm. Accordingly, a two dimensional gas cannot form below the recess R since the remained thickness of the barrier layer 105 below the recess R is too thin to form an effective polarization between the barrier layer 105 and the channel layer 104. By doing so, the semiconductor cell 2 can perform as an enhanced mode transistor. Notably, in other embodiments, the recess R is formed by etching the barrier layer 105 from the first top surface 1051 of the barrier layer 105 to the surface 1415 of the channel layer 104 (i.e. the bottom B of the recess R is the surface 1415 of the channel layer 104), or the recess R is formed by etching the barrier layer 105 through the surface 1415 of the channel layer 104 and then etching a portion of the channel layer 104 away. By doing so, a two dimensional electron gas cannot form below the recess R, and thus a conductive path for the two dimensional electron gas is interrupted. Accordingly, the semiconductor cell 2 can perform as an enhancement mode transistor.

The first conductivity type semiconductor layers 106A and 106B are formed on the active region 100. Specifically, the first conductivity type semiconductor layers 106A and 106B are formed on the barrier layer 105 and have a thickness of 30 nm to 150 nm. A material of the first conductivity type semiconductor layers 106A and 106B can include $In_xGa_{(1-x)}N$ (wherein $0 \leq x < 1$) or $Al_yIn_zGa_{(1-y-z)}N$ (wherein $0 < y < 1$ and $0 \leq z < 1$) such as aluminum nitride, gallium nitride, aluminum gallium nitride, or aluminum gallium indium nitride, and other elements like magnesium can be doped in the first conductivity type semiconductor layers 106A and 106B with a fixed concentration or grading concentration varying along a growth direction. Referring to FIG. 2C and FIG. 3F, the first conductivity type semiconductor layers 106A and 106B can be p-type semiconductor layers with carrier concentrations greater than $1 \times 10^{16}$ $cm^{-3}$ and smaller than $1 \times 10^{18}$ $cm^{-3}$. The first conductivity type semiconductor layers 106A and 106B are disposed at two sides of the recess R and are devoid of overlapping with the recess R. In other words, the first conductivity type semiconductor layers 106A and 106B are not disposed in the recess R. Specifically, the recess R has a first side wall RW1 and the first conductivity type semiconductor layer 106A has a first side 1061A aligned with the first side wall RW1 of the recess R; the recess R has a second side wall RW2 and the first conductivity type semiconductor layer 106B has a second side 1061B aligned with the second side wall RW2 of the recess R.

The dielectric layer 107 is formed on the active region 100 by a method like chemical vapor deposition. Specifically, the dielectric layer 107 is formed on the first conductivity type semiconductor layers 106A and 106B and covers the recess R. The chemical vapor deposition can include plasma enhanced chemical vapor deposition (PECVD), low-pressure chemical vapor deposition (LPCVD), atomic layer deposition (ALD), or metal organic chemical vapor deposition (MOCVD). A material of the dielectric layer 107 can include an insulative material such as a nitride material, an oxide material, or an oxynitride material wherein the nitride material can be silicon nitride $SiN_x$, the oxide material can be silicon oxide $SiO_2$ or aluminum oxide $Al_2O_3$, and the oxynitride material can be silicon oxynitride $SiON_x$. Referring to FIG. 3D, the dielectric layer 107 covers the bottom B of the recess R, the first side wall RW1, the second side wall RW2, the top surface 1062A and the first side 1061A of the first conductivity type semiconductor layer 106A, and the top surface 1062B and the second side 1061B of the first conductivity type semiconductor layer 106B. In the embodiment, by an arrangement of the first conductivity type semiconductor layers 106A and 106B, and the dielectric layer 107, the current leakage problem on a surface of the semiconductor power device S can be alleviated. Additionally, an electric field concentration problem on edges of the recess R under the gate electrode 110c can be solved and then values of peaks of the electric field can be reduced and the electric field can distribute evenly by the p-type semiconductor layer 106A and 106B, so as to avoid the semiconductor power device S from being burned and increase a breakdown voltage of the semiconductor power device S. Moreover, a control failure of the gate electrode 110 can be prevented when the semiconductor power device S is actuated. Furthermore, an operating voltage of the gate electrode 110 and a driving current of the semiconductor power device S can be increased, so as to enhance an output power of the semiconductor power device S and optimize applications of the semiconductor power device S.

The source electrode 108 and the drain electrode 109 are formed on the active region 100. Specifically, each of the source electrode 108 and the drain electrode 109 is disposed on the barrier layer 105 and can include titanium, aluminum, gold, nickel, platinum, or molybdenum. Each of the source electrode 108 and the drain electrode 109 can further include a metal stack made of two or more than two of the abovementioned materials. While forming the source electrode 108 and the drain electrode 109, material thereof can be further processed. For example, a portion of the metal stack can be melted by heating under an eutectic temperature thereof so as to form an alloy and ohmically contact the barrier layer 105. The gate electrode 110 is formed between the source electrode 108 and the drain electrode 109, and a material of the gate electrode 110 includes nickel, gold, tungsten, molybdenum, titanium nitride, titanium tungsten, platinum, or aluminum. The gate electrode 110 can further include a stack made of two or more than two of the abovementioned materials and can be disposed on the dielectric layer 107 to be functioned as a control electrode for turning on/off the semiconductor power device S. In the embodiment, a portion of the gate electrode 110 is disposed in the recess R, and the dielectric layer 107 is disposed between the barrier layer 105 and the gate electrode 110 and between the first conductivity type semiconductor layers 106A and 106B and the gate electrode 110. A shape of the gate electrode 110 can include a rectangle or a T-shape. Additionally, the gate electrode 110 in the embodiment is close to the source electrode 108 and far from the drain electrode so that a breakdown voltage of the semiconductor power device S can be increased. The source electrode 108, the drain electrode 109, and the gate electrode 110 are functioned as terminals to electrically connect an external electronic device. An operation state of the semiconductor cell 2 and a distribution of a two dimensional electron gas can be adjusted based on actual needs.

The passivation layer 111 is formed to cover a surface of the semiconductor cell 2 by a method like chemical vapor deposition. Herein, the chemical vapor deposition can include plasma enhanced chemical vapor deposition (PECVD), low-pressure chemical vapor deposition (LPCVD), atomic layer deposition (ALD), or metal organic chemical vapor deposition (MOCVD). A material of the passivation layer 111 can include an insulative material such as a nitride material, an oxide material, or an oxynitride material wherein the nitride material can be silicon nitride $SiN_x$, the oxide material can be silicon oxide $SiO_2$ or aluminum oxide $Al_2O_3$, and the oxynitride material can be silicon oxynitride $SiON_x$. Referring to FIG. 3F, the passivation layer 111 covers surfaces of the barrier layer 105, the source electrode 108, the drain electrode 109, and the gate electrode 110 to prevent the current leakage problem on a surface the semiconductor power device S; to prevent the semiconductor power device S from deteriorating due to moisture entering the barrier layer 105 and the channel layer 104; to prevent the electrodes from being burned due to an electric arc formed therebetween. In other embodiment, a passivation layer (not shown in figures) can cover a surface and a portion of side walls of a semiconductor cell to prevent electrical properties of a semiconductor power device from being impacted by packaging afterwards.

Notably, a cap layer (not show in figures) can be formed on the active region 100 in the embodiment. Specifically, the cap layer can be formed on the barrier layer 105 and has an energy gap smaller than the second energy gap of the barrier layer 105. In details, a lattice constant of the cap layer is greater than that of the barrier layer 105. A material of the cap layer can include $In_xGa_{(1-x)}N$ (wherein 0≤x<1), such as gallium nitride (GaN) without dopants or with dopants like silicon from silane precursor. Additionally, the cap layer is functioned as a passivation layer to prevent a surface of the barrier layer 105 from damage in a subsequent processes. Nevertheless, in another semiconductor power device, a cap layer can be omitted or disposed based on actual needs.

Figure 4:
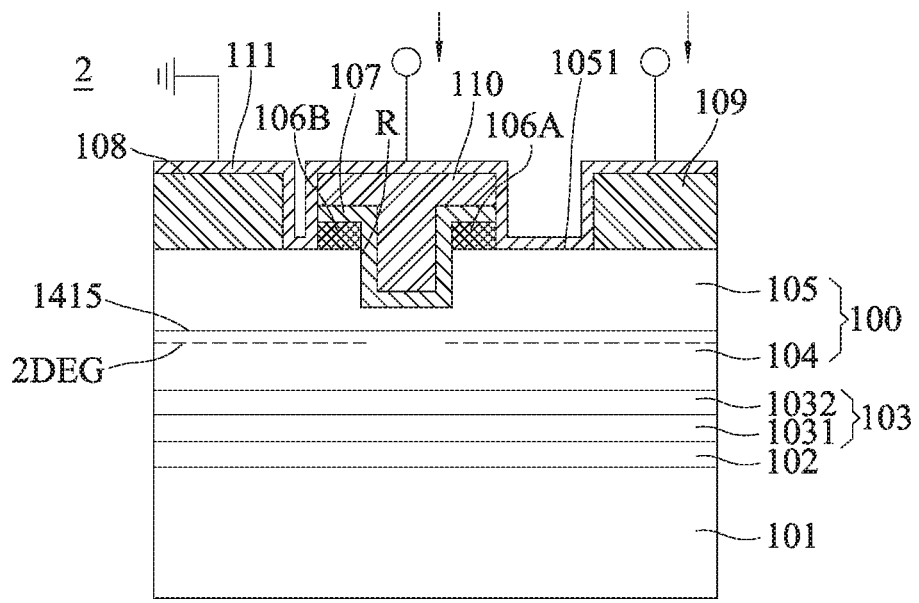
FIG. 4 shows a conduction state of the semiconductor cell disclosed in the second embodiment of the present application.

FIG. 4 shows a conduction state of the semiconductor cell 2 in accordance with the second embodiment of the preset application. The second semiconductor cell 2 of the embodiment can be an enhancement mode transistor. When a positive voltage (for example, +10V) is applied to the drain electrode 109, the source electrode 108 is grounded (0V), and a positive voltage (for example, +5V) is applied to the gate electrode 110, the semiconductor cell 2 is turned on because the Femi level is shifted upwards so a conductive band of the barrier layer 105 which is located below the gate electrode 110 is under the Femi level and a two dimensional electron gas is formed below the gate electrode 110 accordingly. In the meantime, the semiconductor cell 2 is in a conduction state.

Figure 5A:
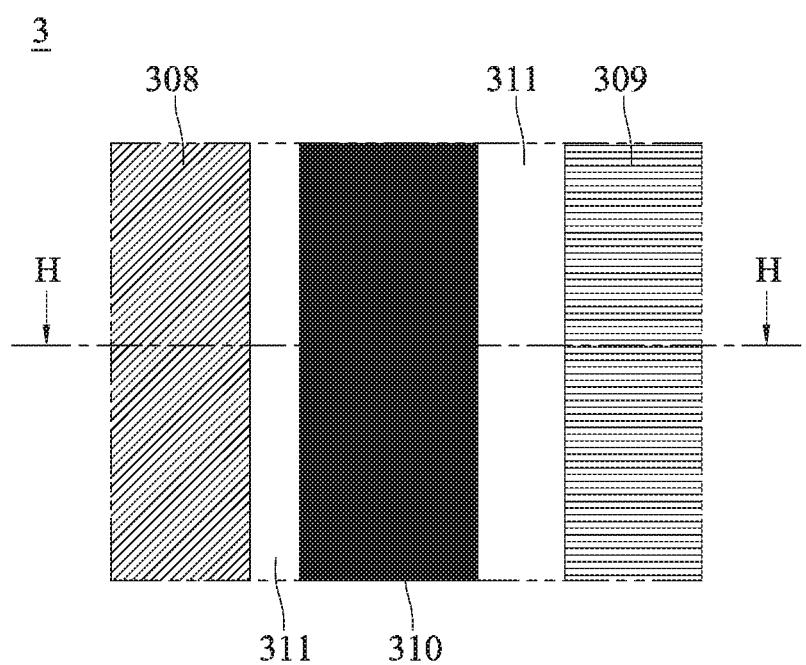
FIG. 5A shows a detailed view of a semiconductor cell disclosed in a third embodiment of the present application.
Figure 5B:
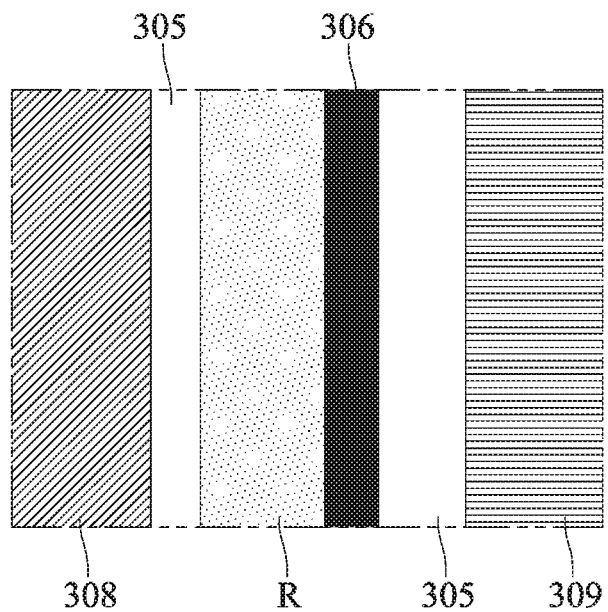
FIG. 5B shows a perspective view of a passivation layer and a gate electrode as shown in FIG. 5A.
Figure 5C:
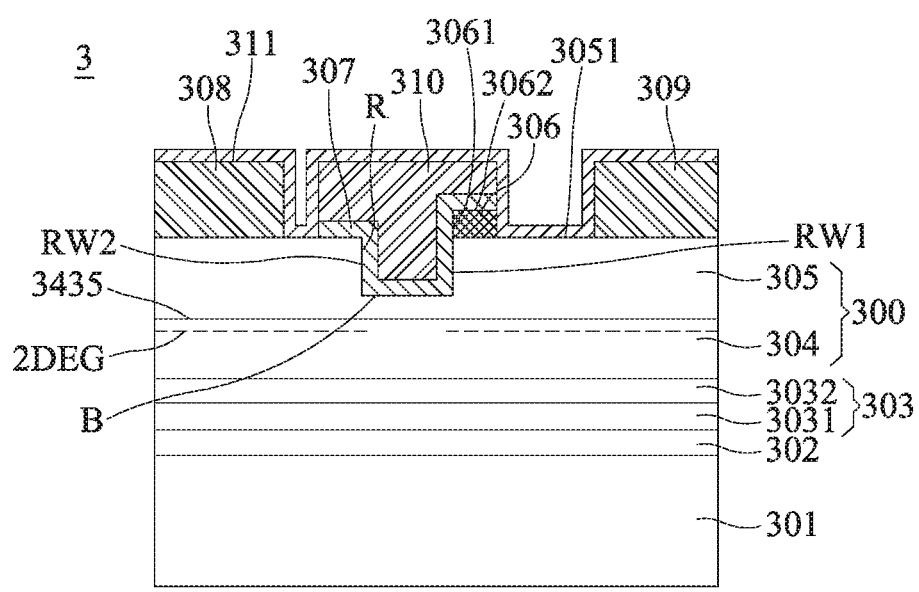
FIG. 5C shows a cross-sectional view taken along a sectional line HH of the semiconductor cell as shown in FIG. 5A.

FIG. 5A to FIG. 5C show a semiconductor cell 3 in accordance with a third embodiment of the present application. In the embodiment, the semiconductor cell 3 can replace the semiconductor cell 1 in FIG. 1 for manufacturing the semiconductor power device S. Herein, FIG. 5A shows a top view of the semiconductor cell 3; FIG. 5B shows a perspective view of a passivation layer and a gate electrode of the third semiconductor cell 3; FIG. 5C shows a cross-sectional view taken along a sectional line HH of the semiconductor cell 3 in FIG. 5A. The semiconductor cell 3 of the embodiment is similar to that shown in FIG. 3A to FIG. 3F. The difference is that a first conductivity type semiconductor layer 306 of the embodiment is disposed between a gate electrode 310 and a drain electrode 309 and devoid of overlapping with a recess R. In details, the first conductivity type semiconductor layer 306 is not disposed in the recess R for solving an electrical filed concentration problem between the gate electrode 310 and the drain electrode 309. Referring to FIG. 5C, the first conductivity type semiconductor layer 306 can be p-type semiconductor layer with a carrier concentration greater than $1 \times 10^{16}$ cm$^{-3}$ and smaller than $1 \times 10^{18}$ cm$^{-3}$. The recess R has a first side wall RW1, and the first conductivity type semiconductor layer 306 has a first side 3061 aligned with the first side wall RW1 of the recess R. A dielectric layer 307 is formed on a barrier layer 305 and covers a bottom B of the recess R, the first side wall RW1, a second side wall RW2, the first side 3061 and a top surface 3062 of the first conductivity type semiconductor layer 306, and a portion of a first top surface 3051 of the barrier layer 305. A portion of the gate electrode 310 is disposed in the recess R and another portion of the gate electrode 30 is disposed outside of the recess R. The dielectric layer 307 is disposed between the barrier layer 305 and the gate electrode 310 and between the first conductivity type semiconductor layer 306 and the gate electrode 310. A shape of the gate electrode 310 can include a rectangle or T-shape. In the embodiment, the electric field distributes between the gate electrode 310 and the drain electrode 309 mainly. By an arrangement of the first conductivity type semiconductor layer 306 and the dielectric layer 307, a current leakage problem on a surface of the semiconductor power device S can be improved. Additionally, under the gate electrode 310 and the drain electrode 309, an electric field concentration problem on edges of the recess R can be solved, and the distribution of the electric filed under the gate electrode 310 can be dispersed so as to avoid the semiconductor power device S from being burned and increase a breakdown voltage of the semiconductor power device S. Moreover, a control failure of the gate electrode 310 can be prevented when the semiconductor power device S is actuated. Furthermore, an operating voltage of the gate electrode 310 and a driving current of the semiconductor power device S can be increased so as to enhance an output power of the semiconductor power device S and optimize applications of the semiconductor power device S.

Figure 6:
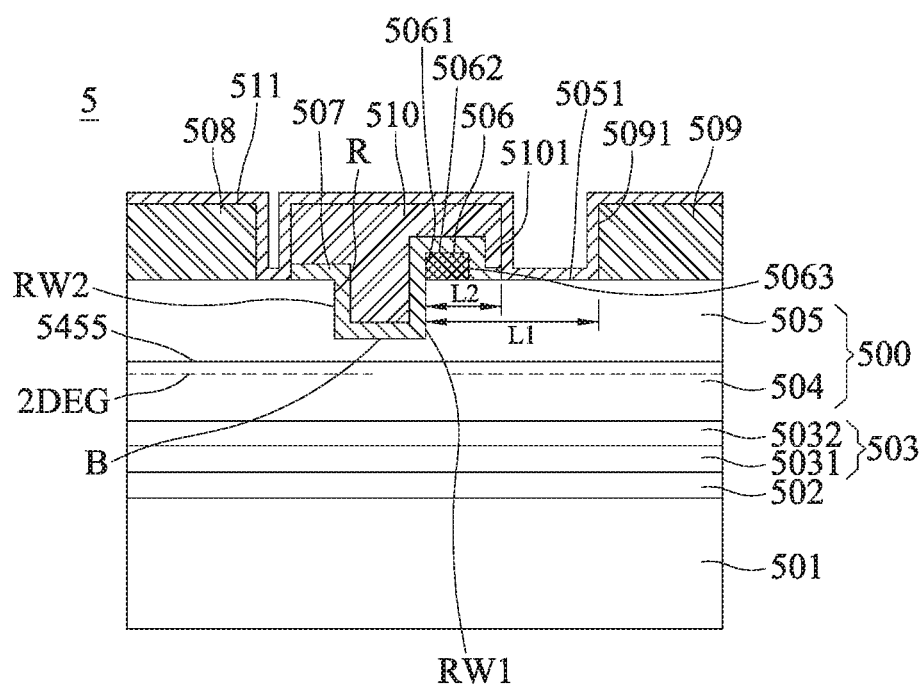
FIG. 6 shows a semiconductor cell disclosed in a fourth embodiment of the present application.

FIG. 6 shows a semiconductor cell 5 in accordance with a fourth embodiment of the present application. In the embodiment, the semiconductor cell 5 replaces the semiconductor cell 1 in FIG. 1 for manufacturing the semiconductor power device S. Herein, the semiconductor cell 5 of the embodiment is similar to that of in FIGS. 5A~5C, and the difference is the semiconductor cell 5 of the embodiment further includes a dielectric layer 507 and a field plate for a gate electrode 510. By doing so, the electrical filed between the gate electrode 510 and a drain electrode 509 is more uniform. The dielectric layer 507 of the embodiment covers a first side 5061, a second top surface 5062, and a second side 5063 of a first conductivity type semiconductor layer 506 and extends along the second side 5063 of the first conductivity type semiconductor layer 506 to a first top surface 5051 of the barrier layer 505, and the gate electrode 510 covers the dielectric layer 507 entirely. Herein, there are a first length L1 from a first side wall RW1 of a recess R to a side 5091 of the drain electrode 509 and a second length L2 from the first side wall RW1 of the recess R to a side 5101 of the gate electrode 510, wherein L2 is smaller than a half of L1 (L2<½L1) so that it can prevent the gate electrode 510 and the drain electrode 509 electrodes from being burned due to an electric arc formed therebetween.

It is believed that the present embodiments and their advantages will be understood from the foregoing description, and it will be apparent that various changes may be made thereto without departing from the spirit and scope of the embodiments or sacrificing all of its material advantages.

What is claimed is:

1. A semiconductor power device comprising:
   a substrate;
   an active region formed on the substrate, comprising:
      a channel layer;
      a barrier layer comprising a top surface opposite to the channel layer; and
      a two-dimensional gas formed near an interface between the channel layer and the barrier layer;

a recess formed in the barrier layer, wherein the recess extends from the top surface into the barrier layer;

a first conductivity type semiconductor layer disposed on the top surface and devoid of overlapping with the recess;

a gate electrode disposed on the active region, wherein a portion of the gate electrode is disposed in the recess;

a dielectric layer disposed between the active region and the gate electrode.

2. The semiconductor power device as claimed in claim 1, wherein the first conductivity type semiconductor layer is a p-type semiconductor layer and has a carrier concentration greater than $1 \times 10^{16}$ cm$^{-3}$ and smaller than $1 \times 10^{18}$ cm$^{-3}$.

3. The semiconductor power device as claimed in claim 2, further comprising a drain electrode and a source electrode disposed on the active region, wherein the gate electrode is disposed between the drain electrode and the source electrode.

4. The semiconductor power device as claimed in claim 3, wherein the first conductivity type semiconductor layer is disposed between the recess and the drain electrode.

5. The semiconductor power device as claimed in claim 4, wherein the gate electrode covers the first conductivity type semiconductor layer.

6. The semiconductor power device as claimed in claim 5, wherein the recess has a first side wall, and the first conductivity type semiconductor layer has a first side aligned with the first side wall of the recess.

7. The semiconductor power device as claimed in claim 5, further comprising a plurality of the first conductivity type semiconductor layers, wherein one of the plurality of the first conductivity type semiconductor layers is disposed between the recess and the drain electrode and another one of the plurality of the first conductivity type semiconductor layers is disposed between the recess and the source electrode.

8. The semiconductor power device as claimed in claim 3, wherein the recess has a first side wall, and a first length from the first side wall of the recess to a side of the drain electrode is greater than twice of a second length from the first side wall of the recess to a side of the gate electrode.

9. The semiconductor power device as claimed in claim 3, wherein the gate electrode is close to the source electrode and far from the drain electrode.

10. The semiconductor power device as claimed in claim 9, further comprising a plurality of the first conductivity type semiconductor layers, wherein the recess has a first side wall and a second side wall, and two of the first conductivity type semiconductor layers are disposed at the first side wall and the second side wall respectively.

11. The semiconductor power device as claimed in claim 1, wherein the dielectric layer is located in the recess and disposed between the first conductivity type semiconductor layer and the gate electrode.

12. The semiconductor power device as claimed in claim 1, wherein the recess has a bottom, and the dielectric layer directly contacts the bottom.

13. The semiconductor power device as claimed in claim 1, wherein the first conductivity type semiconductor layer has a side and a top surface, and the dielectric layer covers the recess and extends to the top surface of the first conductivity type semiconductor layer along the side.

14. The semiconductor power device as claimed in claim 1, wherein the dielectric layer covers the recess and the first conductivity type semiconductor layer and extends to the top surface of the barrier layer.

15. The semiconductor power device as claimed in claim 1, further comprising a drain electrode and a source electrode disposed on the active region wherein the first conductivity type semiconductor layer is disposed between the source and the drain electrode.

16. The semiconductor power device as claimed in claim 15, further comprising a plurality of the first conductivity type semiconductor layers, wherein one of the plurality of the first conductivity type semiconductor layers is disposed between the recess and the drain electrode and another one of the plurality of the first conductivity type semiconductor layers is disposed between the recess and the source electrode.

17. The semiconductor power device as claimed in claim 1, wherein a material of the first conductivity type semiconductor layer comprises $In_xGa_{(1-x)}N$ and $0 \leq x < 1$, or $Al_yIn_zGa_{(1-y-z)}N$ and $0 < y < 1$ and $0 \leq z < 1$.

18. The semiconductor power device as claimed 1 further comprising a plurality of the first conductivity type semiconductor layers, wherein the recess has a first side wall and a second side wall, one of the first conductivity type semiconductor layers has a first side aligned with the first side wall, and another of the first conductivity type semiconductor layers has a second side aligned with the second side wall.

19. The semiconductor power device as claimed in claim 1, wherein the recess has a depth from the top surface of the barrier layer to a bottom of the recess, the barrier layer has a thickness, and the depth is smaller than the thickness.

* * * * *